(12) United States Patent
Lee et al.

(10) Patent No.: US 12,024,149 B2
(45) Date of Patent: Jul. 2, 2024

(54) WHEEL SPEED SENSOR INTERFACE CIRCUIT, OPERATION METHOD THEREOF, AND ELECTRONIC CONTROL SYSTEM

(71) Applicant: HL MANDO CORPORATION, Pyeongtaek-si (KR)

(72) Inventors: Changwoo Lee, Seongnam-si (KR); Kwanseek Kim, Hwaseong-si (KR)

(73) Assignee: HL MANDO CORPORATION, Pyeongtaek-si (KR)

( * ) Notice: Subject to any disclaimer, the term of this patent is extended or adjusted under 35 U.S.C. 154(b) by 682 days.

(21) Appl. No.: 17/274,327

(22) PCT Filed: Sep. 6, 2019

(86) PCT No.: PCT/KR2019/011531
§ 371 (c)(1),
(2) Date: Mar. 8, 2021

(87) PCT Pub. No.: WO2020/050674
PCT Pub. Date: Mar. 12, 2020

(65) Prior Publication Data
US 2021/0323521 A1    Oct. 21, 2021

(30) Foreign Application Priority Data
Sep. 6, 2018   (KR) .................. 10-2018-0106586

(51) Int. Cl.
*B60T 8/88* (2006.01)
*G01R 19/165* (2006.01)
*G01R 31/00* (2006.01)

(52) U.S. Cl.
CPC ........ *B60T 8/885* (2013.01); *G01R 19/16528* (2013.01); *G01R 31/007* (2013.01); *B60Y 2400/3032* (2013.01)

(58) Field of Classification Search
CPC . B60T 8/885; G01R 19/16528; G01R 31/007; G01R 31/2829; B60Y 2400/3032; G01P 3/489; G01P 21/02; G01P 3/4802
See application file for complete search history.

(56) References Cited

U.S. PATENT DOCUMENTS

| 4,605,920 A | 8/1986 | Naisuler |
| 5,510,707 A | 4/1996 | Caron |
| (Continued) | | |

FOREIGN PATENT DOCUMENTS

| CN | 1925291 A | 3/2007 |
| CN | 101071304 A | 11/2007 |
| (Continued) | | |

OTHER PUBLICATIONS

Office Action issued on Sep. 7, 2022, in connection with Chinese Patent Application No. 201980058641.3, 11 pages.
(Continued)

*Primary Examiner* — Christopher P McAndrew
*Assistant Examiner* — Zannatul Ferdous
(74) *Attorney, Agent, or Firm* — Hauptman Ham, LLP

(57) ABSTRACT

The present disclosure provides a wheel speed sensor interface circuit, an operation method thereof, and an electronic control system, the wheel speed sensor interface circuit comprising: a first signal processing unit for receiving a first current signal sensed by a high side of a wheel speed sensor and processing the first current signal to output a first voltage signal; a second signal processing unit for receiving a second current signal sensed by a low side of the wheel speed sensor and processing the second current signal to output a second voltage signal; and a verification unit for comparing the first voltage signal and the second voltage signal with each other and verifying whether the first voltage signal and the second voltage signal are normal. According (Continued)

to the present disclosure, reliability and redundancy for a process of transmitting wheel speed information can be secured.

9 Claims, 15 Drawing Sheets

(56) References Cited

U.S. PATENT DOCUMENTS

| | | | |
|---|---|---|---|
| 6,297,673 | B1 | 10/2001 | Walther |
| 10,377,360 | B1* | 8/2019 | Abaziou ............... B60T 17/221 |
| 2007/0265748 | A1 | 11/2007 | Koo |
| 2015/0120164 | A1* | 4/2015 | Kim ........................ B60T 8/32 |
| | | | 701/74 |
| 2015/0298672 | A1 | 10/2015 | Lee |
| 2015/0340978 | A1 | 11/2015 | Seo et al. |
| 2016/0084867 | A1* | 3/2016 | Shafer ..................... G01P 3/489 |
| | | | 324/174 |
| 2017/0299625 | A1 | 10/2017 | Park |
| 2020/0122700 | A1* | 4/2020 | Abaziou ................ G01P 3/489 |

FOREIGN PATENT DOCUMENTS

| | | |
|---|---|---|
| CN | 102086799 A | 6/2011 |
| CN | 105083279 A | 11/2015 |
| CN | 105137123 A | 12/2015 |
| CN | 107300626 A | 10/2017 |
| CN | 110687312 A | 1/2020 |
| EP | 3590776 A1 | 1/2020 |
| JP | S52-143626 A | 11/1977 |
| JP | 6-174734 A | 6/1994 |
| JP | H7-50564 A | 2/1995 |
| JP | 8-26091 A | 1/1996 |
| JP | H11-20653 A | 1/1999 |
| JP | 2007-159181 A | 6/2007 |
| JP | 2012-80711 A | 4/2012 |
| KR | 10-1203872 B1 | 11/2012 |
| KR | 10-2015-0119655 A | 10/2015 |
| KR | 10-2017-0106606 A | 9/2017 |

OTHER PUBLICATIONS

Extended European Search Report issued Apr. 11, 2022, corresponding to European Patent Application No. 19857744.7 citing the above reference(s).
International Search Report issued on Dec. 18, 2019 for corresponding international application No. PCT/KR2019/011531, citing the above references.
Written Opinion issued on Dec. 18, 2019 for corresponding international application No. PCT/KR2019/011531, citing the above references.
Chinese Office Action issued on Dec. 11, 2023, in connection with the Chinese Patent Application No. 201980058641.3, with English machine translation (11 pages).

* cited by examiner

WHEEL SPEED SENSOR INTERFACE CIRCUIT, OPERATION METHOD THEREOF, AND ELECTRONIC CONTROL SYSTEM

CROSS-REFERENCE TO RELATED APPLICATION

The present application is a national stage filing under 35 U.S.C § 371 of PCT application number PCT/KR2019/011531 filed on Sep. 6, 2019 which is based upon and claims the benefit of priorities to Korean Patent Application No. 10-2018-0106586, filed on Sep. 6, 2018, in the Korean Intellectual Property Office, which are incorporated herein in their entireties by reference.

TECHNICAL FILED

The present disclosure relates to a wheel speed sensor interface circuit for recognizing and transmits a wheel speed sensor current to a control device, a method of operating the same, and an electronic control system.

BACKGROUND ART

Various devices are installed in a vehicle to improve vehicle driving stability and brake stability, for example, an anti-lock brake system (ABS) and a traction control system (TCS) for preventing wheel slip, an electronic stability program (ESP) for a vehicle attitude control, a continuous damping control (CDC) for suspension, and an electric power steering (ESP) for steering are installed.

The above devices receive signals from various sensors such as a yaw rate sensor, a steering angle sensor, a wheel speed sensor, a brake pressure sensor, and a lateral acceleration sensor to control a brake controller and an engine controller. In particular, the wheel speed sensor is a key sensor that transmits the wheel speed signal of a vehicle, and most of the electronic control units (ECUs) installed in the vehicle monitor sensor information. One wheel speed sensor is applied to each wheel of a vehicle, and plays an important role in control devices such as ABS.

Therefore, in order to secure the driving safety of the vehicle, it is required the higher safety and reliability for the operation of the wheel speed sensor and the wheel speed sensor interface circuit.

DISCLOSURE

Technical Problem

In this background, an object of the present disclosure is to provide with a wheel speed sensor interface circuit capable of securing reliability and redundancy for a process of transmitting speed information by comparing voltage signals output according to current signals sensed at the high side and low side of the wheel speed sensor to verify normal operation, a method of operating the same, and an electronic control system.

Another object of the present disclosure is to provide with a wheel speed sensor interface circuit capable of securing reliability and redundancy for the process of transmitting wheel speed information at a lower cost by omitting some components of the wheel speed sensor interface circuit connected to the low side of the wheel speed sensor, a method of operating the same, and an electronic control system.

Technical Solution

In order to achieve the above object, in one aspect, the present disclosure provides a wheel speed sensor interface circuit including a first signal processing unit for receiving a first current signal sensed by a high side of a wheel speed sensor, processing the first current signal, and outputting a first voltage signal, a second signal processing unit for receiving a second current signal sensed by a low side of the wheel speed sensor, processing the second current signal, and outputting a second voltage signal, and a verification unit for comparing the first voltage signal and the second voltage signal to verify whether the first voltage signal and the second voltage signal are normal.

In another aspect, the present disclosure provides an operation method of a wheel speed sensor interface circuit including receiving a first current signal sensed by a high side of a wheel speed sensor, processing the first current signal and outputting a first voltage signal, receiving a second current signal sensed by a low side of the wheel speed sensor, processing the second current signal and outputting a second voltage signal, and verifying whether the first voltage signal and the second voltage signal are normal by comparing the first voltage signal and the second voltage signal.

In another aspect, the present disclosure provides a wheel speed sensor interface circuit including a first signal processing unit for receiving a first current signal sensed by a high side of a first wheel speed sensor processing the first current signal to output a first voltage signal, a second signal processing unit for receiving a second current signal sensed by a low side of a second wheel speed sensor and processing the second current signal to output a second voltage signal, and a verification unit for comparing the first voltage signal and the second voltage signal with each other to verify whether the first voltage signal and the second voltage signal are normal.

In another aspect, the present disclosure provides an electronic control system including a wheel speed sensor for sensing a speed of a wheel of a vehicle, a wheel speed sensor interface circuit for processing a first current signal sensed at a high side of the wheel speed sensor to output a first voltage signal, for processing a second current signal sensed at a low side of the wheel speed sensor to output a second voltage signal, and for comparing the first voltage signal and the second voltage signal to verify whether the first voltage signal and the second voltage signal are normal, and a micro control unit for controlling the vehicle based on at least one of the first voltage signal and the second voltage signal.

Advantageous Effects

As described above, according to the present disclosure, by comparing the voltage signals output according to the current signals sensed at the high side and the low side of the wheel speed sensor to verify normal operation, it is possible to provide a wheel speed sensor interface circuit, an operation method thereof, and an electronic control system capable of securing the reliability and redundancy for the wheel speed information transmission process.

In addition, according to the present disclosure, it is possible to provide a wheel speed sensor interface circuit, an operation method thereof, and an electronic control system capable of securing reliability and redundancy for the process of transmitting wheel speed information at a lower cost by omitting some components of the wheel speed sensor interface circuit connected to the low side of the wheel speed sensor.

MODE FOR DISCLOSURE

Figure 1:
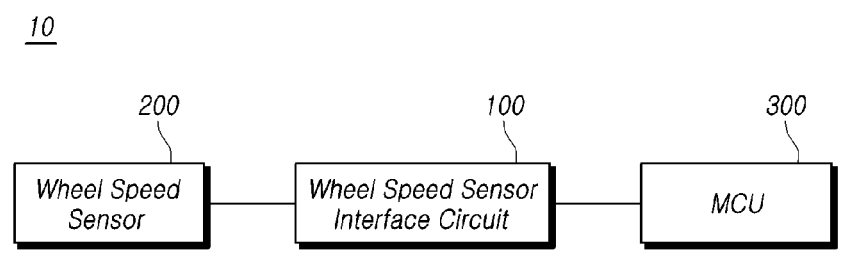
FIG. 1 is a block diagram of an electronic control system according to an embodiment of the present disclosure.

Hereinafter, some embodiments of the present disclosure will be described in detail through exemplary drawings. In adding reference numerals to elements of each drawing, the same elements may have the same numerals as possible even if they are indicated on different drawings. Further, in describing the present disclosure, detailed descriptions of related known configurations or functions may be omitted when it is determined that the description may make the subject matter in some embodiments of the present disclosure rather unclear.

In addition, terms, such as "first", "second", "A", "B", "(A)", "(B)", "(a)" or "(b)" may be used herein to describe elements of the disclosure. Each of these terms is not used to define essence, order or sequence, but is used merely to distinguish the corresponding element from other elements. If a component is described as being "connected", "coupled" or "connected" to another component, it should be understood that the component may be directly connected or connected to that other component, but another component may be "connected", "coupled" or "connected" between each component.

Unless otherwise defined, all terms (including technical and scientific terms) used in the present disclosure may be used as meanings commonly understood by those skilled in the art to which the embodiments of the present disclosure pertain. In addition, terms to be described later are terms defined in consideration of functions in the embodiments of the present disclosure, which may vary according to a user's or operator's intention or practice. Therefore, the definition should be made based on the contents throughout the present disclosure.

In this disclosure, "a high side of a wheel speed sensor" means the side of a wheel speed sensor connected to a power supply. Also, "a low side of a wheel speed sensor" means the side of the wheel speed sensor connected to the ground. Further, "a first current signal" refers to a current signal sensed at the high side of the wheel speed sensor. Further, "a first voltage signal" refers to a voltage signal from which the first current signal is output through the wheel speed sensor interface circuit. Further, "a second current signal" refers to a current signal sensed at the low side of the wheel speed sensor. Further, "a second voltage signal" refers to a voltage signal from which the second current signal is output through the wheel speed sensor interface circuit. In addition, in the present disclosure, "wheel sensor" may be used to mean "wheel speed sensor", and "interface circuit" may be used to mean "wheel speed sensor interface circuit".

Hereinafter, it will be described a wheel speed sensor interface circuit, an operation method thereof, and an electronic control system according to embodiments of the present disclosure with reference to the accompanying drawings.

Figure 2:
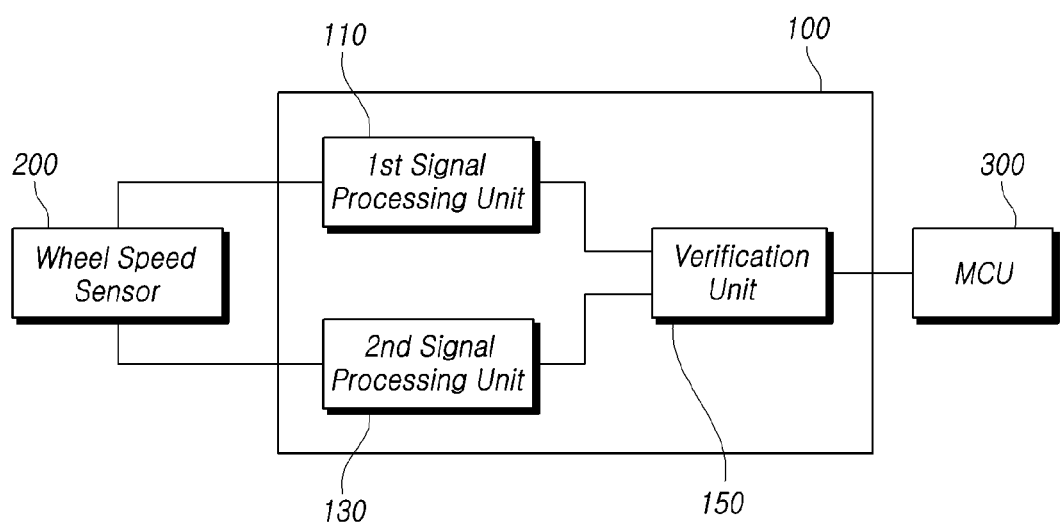
FIG. 2 is a block diagram of a wheel speed sensor interface circuit according to an embodiment of the present disclosure.

FIG. 1 is a block diagram of an electronic control system according to the present disclosure. FIG. 2 is a block diagram of a wheel speed sensor interface circuit according to the present disclosure.

Referring to FIG. 1, an electronic control system 10 according to the present disclosure includes a wheel speed sensor 200 for sensing a speed of a wheel of a vehicle, a wheel speed sensor interface circuit 100 for processing a first current signal sensed at a high side of the wheel speed sensor to output a first voltage signal, for processing a second current signal sensed at a low side of the wheel speed sensor to output a second voltage signal, and for comparing the first voltage signal and the second voltage signal to verify whether the first voltage signal and the second voltage signal are normal, and a micro control unit 300 for controlling the vehicle based on at least one of the first voltage signal and the second voltage signal.

The wheel speed sensor 200 may be provided on each wheel of the vehicle and may output a current signal for sensing the rotational speed of the wheel. According to an example, the wheel speed sensor 200 may receive power within an operating voltage and output a current value (e.g., 7 mA/14 mA) based on the sensed rotational speed of the wheel. The method of sensing the rotational speed of the wheel by the wheel speed sensor 200 is based on publicly known art and is not limited to a specific method. In this way, the wheel speed sensor 200 outputs a current signal, and the output current signal may be converted into a voltage signal through the wheel speed sensor interface circuit 100 so that wheel speed information can be used in an electronic control unit (ECU) or a micro control unit (MCU) for controlling the vehicle.

The wheel speed sensor interface circuit 100 may generate a voltage signal based on the current signal sensed and output by the wheel speed sensor 200. According to the present disclosure, a current signal is sensed at a high side and a low side of the wheel speed sensor 200, respectively, and each current signal may be input to the wheel speed sensor interface circuit 100, respectively. Here, the high side of the wheel speed sensor may be a terminal of the wheel speed sensor connected to the power supply that supplies power to the wheel speed sensor, and the low side of the wheel speed sensor may be a terminal of the wheel speed sensor connected to the ground.

The wheel speed sensor interface circuit 100 may generate a voltage signal corresponding to each current signal by processing a current signal sensed by a high side and a current signal sensed by a low side, respectively. The wheel speed sensor interface circuit 100 may compare the generated voltage signals with each other to determine whether they are the same.

Since the current signal sensed at the high side and the current signal sensed at the low side are sensed according to the rotational speed of the same wheel of the vehicle, in a normal case, they may be output in substantially the same form. Therefore, in the case that there is no abnormality in the wheel speed sensor 200 or the wheel speed sensor interface circuit 100, the voltage signal generated by processing each current signal may be also substantially same within an error range that may occur due to processing in different paths.

If the respective voltage signals are substantially the same, the wheel speed sensor interface circuit 100 may determine that each component of the wheel speed sensor 200 and the wheel speed sensor interface circuit 100 operates normally. In the case that it is determined as normal, the wheel speed sensor interface circuit 100 may transmit at least one of the voltage signals to the micro control unit 300. That is, compared to the case of processing the information sensed by the wheel speed sensor 200 through a single path, as in the prior art, it may be possible to immediately detect when an abnormality occurs by processing and comparing the information sensed through the dual path.

If the respective voltage signals are not substantially identical to each other, the wheel speed sensor interface circuit 100 may determine that any one of each component of the wheel speed sensor 200 or the wheel speed sensor interface circuit 100 has a failure. In the case that it is determined as the failure, the wheel speed sensor interface circuit 100 may transmit a signal notifying the failure to the micro control unit 300.

According to an example, the wheel speed sensor interface circuit 100 may be implemented as one application specific integrated circuit (ASIC). However, this is an example and is not limited thereto. According to another example, the wheel speed sensor interface circuit 100 may be implemented as two or more modules as long as the operations described in the present disclosure can be substantially identically performed.

The micro control unit 300 may receive a voltage signal sensed by the wheel speed sensor 200 and output through the wheel speed sensor interface circuit 100. The micro control unit 300 may generate information on a current state of the vehicle, such as a vehicle speed and a moving direction, based on voltage signals received from the wheel speed sensor interface circuit 100.

According to an example, the micro control unit 300 may be implemented by being included in an ASIC such as the wheel speed sensor interface circuit 100. However, this is an example and is not limited thereto, and the micro control unit 300 may be implemented as a module separate from the wheel speed sensor interface circuit 100. In addition, according to an example, when the micro control unit 300 is included in the electric control unit (ECU) for controlling, determining, and calculating the overall operation as a main computer applied to the vehicle, the micro control unit may perform control of ABS or the like related to the wheels of the vehicle based on information on the current state of the vehicle.

According to this, it is possible to secure the redundancy for the process of transmitting wheel speed information by comparing voltage signals output according to current signals sensed at the high and low sides of the wheel speed sensor and verifying whether the normal operation.

Referring to FIG. 2, it is illustrated a structure for processing a current signal sensed through a dual path in the wheel speed sensor interface circuit 100. As shown in FIG. 2, a first current signal sensed at a high side of the wheel speed sensor 200 may be input to a first signal processing unit 110. The first signal processing unit 110 may process the input first current signal and output a first voltage signal to a verification unit 150.

Similarly, a second current signal sensed at the low side of the wheel speed sensor 200 may be input to a second signal processing unit 130. The second signal processing unit 130 may process the input second current signal and output a second voltage signal to the verification unit 150.

The verification unit 150 may compare the first voltage signal and the second voltage signal to verify whether the first voltage signal and the second voltage signal are normal. Since the first current signal and the second current signal are sensed according to the rotational speed of the same wheel of the vehicle, if there is no abnormality in the wheel speed sensor 200 or the wheel speed sensor interface circuit 100, the first voltage signal and the second voltage signal may appear substantially the same within an error range that may occur due to processing in different paths.

Accordingly, if the first voltage signal and the second voltage signal are substantially the same as each other, the verification unit 150 may determine that the respective components of the wheel speed sensor 200 and the wheel speed sensor interface circuit 100 operate normally. In the case that it is determined that the wheel speed sensor 200 and the wheel speed sensor interface circuit 100 are operating normally, the verification unit 150 may transmit the first voltage signal or the second voltage signal to the micro control unit 300.

The micro control unit 300 may receive a voltage signal sensed by the wheel speed sensor 200 and output through the wheel speed sensor interface circuit 100. The micro control unit 300 may generate information on a current state of the vehicle, such as a vehicle speed and a moving direction, based on voltage signals received from the wheel speed interface circuit 100.

Accordingly, it is possible to secure redundancy for a process of transmitting wheel speed information by comparing voltage signals output according to current signals sensed at the high and low sides of the wheel speed sensor and verifying the normal operation.

Figure 3:
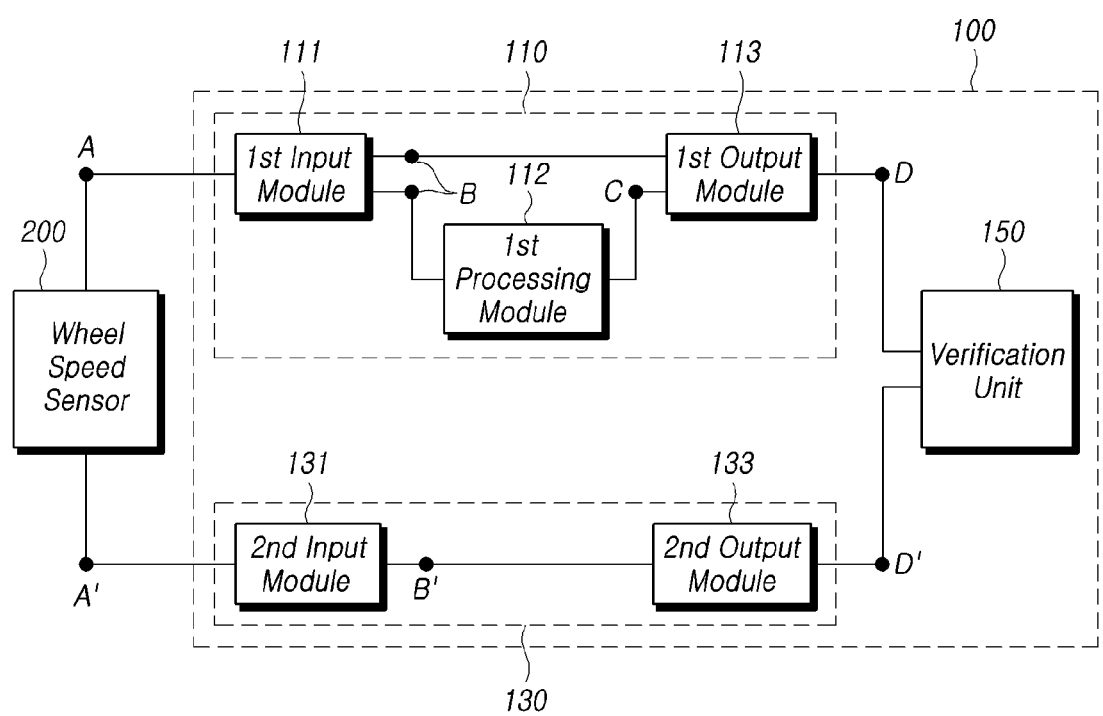
FIG. 3 is a diagram for explaining the operation of a wheel speed sensor interface circuit according to an embodiment of the present disclosure.

FIG. 3 is a diagram for explaining an operation of a wheel speed sensor interface circuit according to an embodiment of the present disclosure.

Referring to FIG. 3, a first signal processing unit 110 of a wheel speed sensor interface circuit 100 includes a first input module 111 for mirroring and outputting a first current signal input from a high side of a wheel speed sensor 200, a first processing module 112 for following a low level current of the first current signal and adjusting a first threshold current according to the followed low level current, and a first output module 113 for comparing the first current signal with the first threshold current and outputting a first voltage signal.

The first input module 111 is connected to the high side of the wheel speed sensor 200 as shown in FIG. 3 to mirror the sensed first current signal. The first input module 110 may output the mirrored first current signal to at least one of the first processing module 112 and the first output module 113. According to an example, in FIG. 3, it is illustrated that the first current signal is output to the first processing module 112 and the first output module 113, but this is an example and is not limited thereto. According to another example, even when the first current signal is output only to the first processing module 112, the following description may be applied substantially the same as long as it does not contradict the technical concept. Here, the mirroring of the first current signal is for receiving the sensed current without distortion. As long as the first input module 111 can output the first current signal in the same form without distortion, the first input module 111 is not limited to a specific circuit or device and may be implemented in various ways.

The first processing module 112 may follow the low level current of the first current signal and may change the first threshold current according to the followed low level current. This is, when an abnormal current such as a leakage current generated due to an external environment is instantaneously large or small, to prevent the voltage signal input to the micro control unit 300 from not being normally applied. According to an example, the first processing module 112 may include an analog-digital converter (ADC) module for detecting a value of the first current signal, a current tracking module for adjusting the first threshold current which is a reference for generating the first voltage signal based on the first current signal, or the like.

Figure 4:
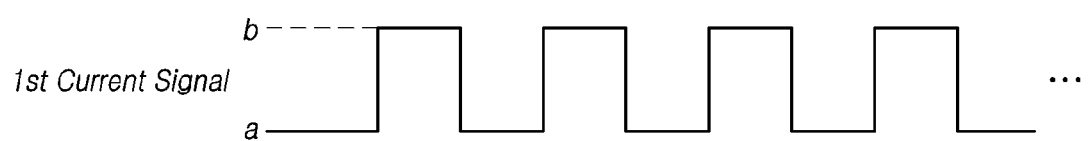
FIGS. 4 to 7 are diagrams for explaining an output signal of a wheel speed sensor interface circuit according to an embodiment of the present disclosure.

Referring to FIG. 3, the first current signal sensed by the high side of the wheel speed sensor 200 may be input to the first input module 111. An example of the first current signal at A shown in FIG. 3 corresponding to the high side of the wheel speed sensor 200 is illustrated in FIG. 4. The first current signal may appear in a form in which a low level "a" and a high level "b" are periodically repeated according the rotation of the wheel. For example, as the rotational speed of the wheel increases, the retention period of the level "b" may be shorter and more often. According to an example, "a" may be implemented as a value of 7 mA and "b" may be implemented as a value of 14 mA, but is not limited thereto.

The first input module 111 may mirror and output the first current signal. In this case, the mirrored first current signal at the output terminal B of the first input module 111 may be output in the same form as in FIG. 4. However, the values of the high level and the low level may be different according to the device characteristics of the first input module 111.

Figure 5:
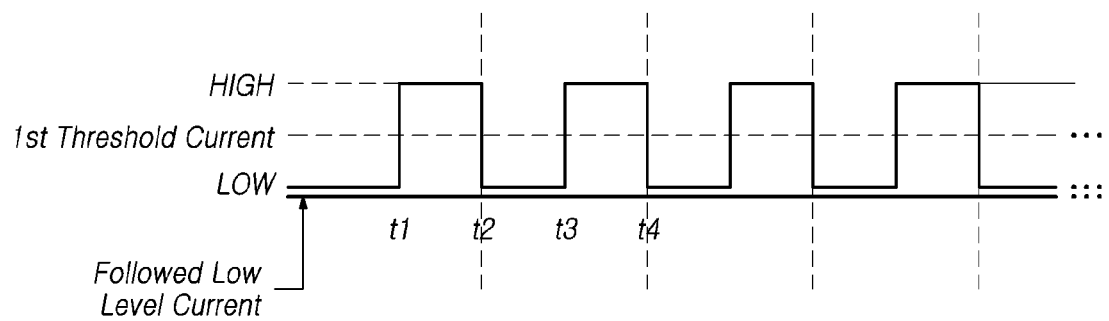

As shown in FIG. 5, the first processing module 112 may detect while following the low level current at the falling edges t2 and t4 where the value of the first current signal changes from a high level to a low level. In FIG. 5, since the first current signal at t2 corresponding to the falling edge is detected at a low level ("a" value in FIG. 4), the followed low level current appears as "a" value until t4, which is a next falling edge for detecting the low level current. In FIG. 5, since the low level of the first current signal at each falling edge has the same value, the followed low level current is continuously detected as the same value.

The first processing module 112 may adjust the first threshold current, which is a reference for generating the first voltage signal, according to the followed low level current. In FIG. 5, since the followed low level current is continuously maintained at a constant value, the first threshold current may also be maintained at a preset value. A case in which the low level current fluctuates will be described again in FIG. 7 below. In C in FIG. 3, the adjusted first threshold current may be output.

Figure 6:
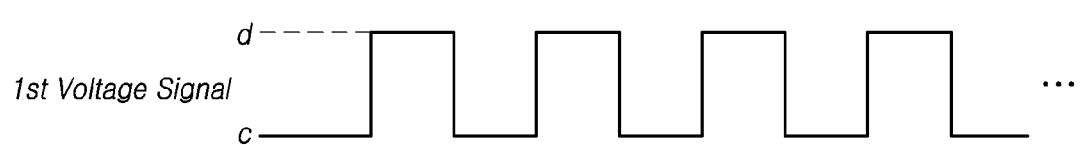

The first output module 113 may generate a first voltage signal by comparing the first current signal with the first threshold current. Referring to FIGS. 5 and 6, since the first current signal is higher than the first threshold current at t1, the first output module 113 may generate the first voltage signal as a value "d", which is a high level among the target voltage levels. Since the first current signal is lower than the first threshold current at t2, the first output module 113 may generate the first voltage signal as a value "c", which is a low level among the target voltage levels. Accordingly, the first voltage signal in D of FIG. 3 may appear as shown in FIG. 6. According to an example, "c" may be implemented as a value of 0V and "d" may be implemented as a value of 3.3V, but is not limited thereto.

The first output module 113 may transmit the generated first voltage signal to the verification unit 150.

According to an example, in FIG. 3, the first processing module 112 and the first output module 113 are separately illustrated, but are not limited thereto. According to another example, the first processing module 112 and the first output module 113 may be implemented as a single module. According to an example, referring to FIG. 7, it will be illustrated an example of a case in which the first current signal is affected by an abnormal current generated by an external environment (t1). Due to the abnormal current, the low level of the first current signal at t3, which is the first falling edge after t1, is increased, so that the followed low level current is also detected as an increased value.

The first processing module 112 may adjust the first threshold current according to the followed low level current. That is, since the low level current followed at t3 starts to be detected as an increased value, the first processing module 112 may adjust the first threshold current to increase according to the low level current.

Figure 7:
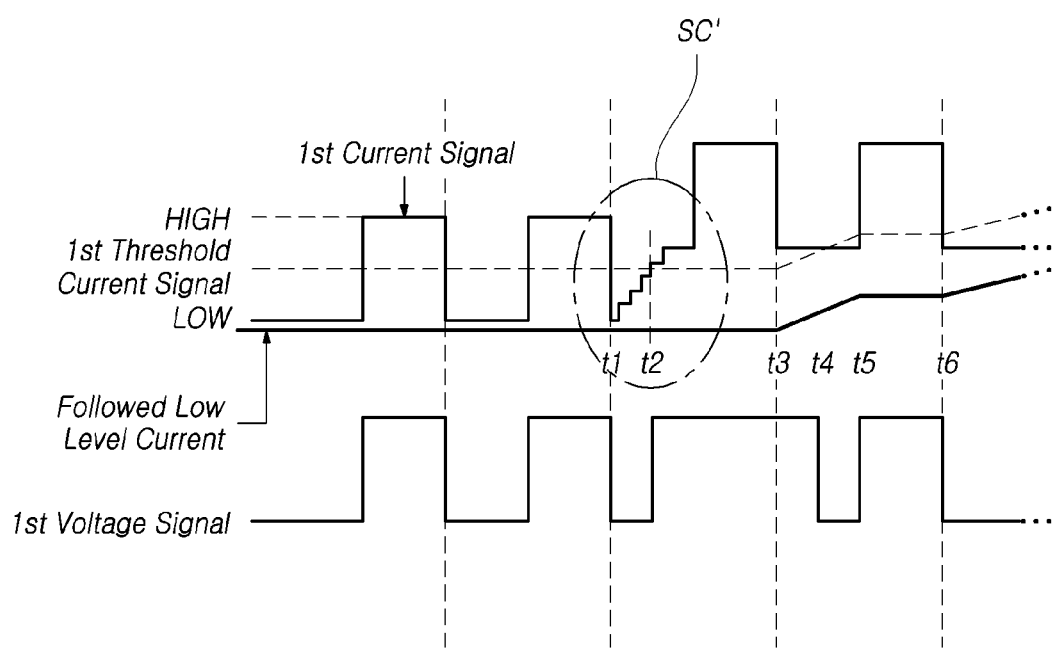

In this case, the first output module 113 may generate the first voltage signal by comparing the first current signal with the first threshold current. Referring to FIG. 7, since the first current signal is higher than the first threshold current at t2, the first output module 113 may generate the first voltage signal at a high level among target voltage levels. If the level of the first threshold current is maintained as it is, since the low level current at the falling edge of the first current signal continues to be higher than the first threshold current, information on the rotation speed of the wheel cannot be transmitted normally.

However, since the first current signal becomes lower than the first threshold current at t4 by changing the first threshold current according to the change of the followed low level current, the first output module 113 may generate the first voltage signal at a low level among target voltage levels. In this way, the first threshold current is changed, and after t5, it may be generated a first voltage signal properly reflecting the first current. Accordingly, it is possible to prevent a phenomenon in which the rotational speed of the wheel is not properly transmitted due to an abnormal current. Referring again to FIG. 3, a second signal processing unit 130 of a wheel speed sensor interface circuit 100 may include a second input module 131 for mirroring and outputting a second current signal input from a low side of a wheel speed sensor 200, and a second output module 133 for outputting a second voltage signal by comparing the second current signal with a second threshold current.

According to an embodiment, compared with the first signal processing unit 110, the second processing module corresponding to the first processing module 112 may be omitted in the second signal processing unit 130. Since the description of the operation of the first input module 111 described above is applied substantially the same to the second input module 131, a detailed description will be omitted in order to avoid duplicate description. That is, the outputs at A' and B' may appear substantially the same as the outputs at A and B described above in a normal state.

The second input module 131 may mirror a second current signal sensed at a low side of a wheel speed sensor 200 and output it to the second output module 133. The second output module 133 may generate a second voltage signal by comparing the second current signal with a second threshold current. According to an example, the value of the second threshold current may be set equal to the initial value of the first threshold current. Accordingly, in the case that the first threshold current is not adjusted, the second voltage signal at D' output from the second output module 133 may be generated the same as the first voltage signal at D described above.

The second output module 133 may transmit the generated second voltage signal to the verification unit 150.

According to an example, the verification unit 150 may include a comparator for comparing the input first voltage signal and the second voltage signal. The verification unit 150 may verify whether the first voltage signal and the second voltage signal are normal based on a comparison result of the first voltage signal and the second voltage signal. Since the first current signal and the second current signal are sensed according to the rotational speed of the same wheel of the vehicle, they may be substantially the same within an error range that may occur due to processing in different paths.

According to an example, in the case that the first voltage signal and the second voltage signal are substantially the same, a difference between the two voltage signals may appear in a form in which a value of 0V is maintained. That is, since the first voltage signal and the second voltage signal are substantially equal to each other so that they are cancelled each other, the difference between the values becomes 0. However, this waveform is an example for convenience of description, and practically, noise may occur due to a time difference between the two paths.

In this case, the verification unit 150 may determine that each component of the wheel speed sensor 200 and the wheel speed sensor interface circuit 100 operates normally. In the case that it is determined in the normal operation, the verification unit 150 may transmit the first voltage signal or the second voltage signal to the micro control unit 300.

According to an example, if the first voltage signal and the second voltage signal are not substantially the same, the difference between the two voltage signals may appear in a form having an arbitrary high level and low level value other than the 0V value. That is, if the first voltage signal and the second voltage signal are not substantially the same, they do not cancel each other.

In this case, the verification unit 150 may determine that each component of the wheel speed sensor 200 and the wheel speed sensor interface circuit 100 is in a failure state. In the case that it is determined in the failure state, the verification unit 150 may transmit a signal informing this to the micro control unit 300. Alternatively, if the verification unit 150 outputs an output corresponding to the difference between the two voltage signals as it is, the micro control unit 300 may determine the failure states.

The micro control unit 300 may display the failure state on a display in the vehicle. Alternatively, the micro control unit 300 may output the failure state through an acoustic output unit in the vehicle or through a vibration of a steering wheel.

In the above, it has been described the case in which there is no processing module in the second signal processing unit 130 connected to the low side of the wheel speed sensor 200, but is not limited thereto. The above description can be applied substantially equally in the case in which there is no processing module in the first signal processing unit 110 connected to the high side of the wheel speed sensor 200.

According to this, by omitting some components of the wheel speed sensor interface circuit connected to the low side of the wheel speed sensor, it is possible to secure the reliability and redundancy for the process of transmitting wheel speed information at a lower cost.

According to an embodiment, the wheel speed sensor interface circuit 100 may further include a verification module 170 for inputting a reference signal to the first processing module, and comparing the output signal of the first processing module according to the reference signal with the reference output to verify whether the first processing module is operating normally. According to an example, the verification module 170 may be implemented as a logic built-in self-test (LBIST) module capable of testing the self-operation of the first processing module 112.

According to an example, when inputting the reference signal to the first processing module 112, the verification module 170 may block the connection between the first input module 111 and the first processing module 112, and may connect between the verification module 170 and the first processing module 112. The verification module 170 may compare whether the reference signal passed through the first processing module 112 matches a pre-stored expected value to verify whether a normal operation of the first processing module 112. When the verification of the normal operation of the first processing module 112 is completed, the verification module 170 may block a connection between the verification module 170 and the first processing module 112 while connecting between the first input module 111 and the first processing module 112.

Figure 8:
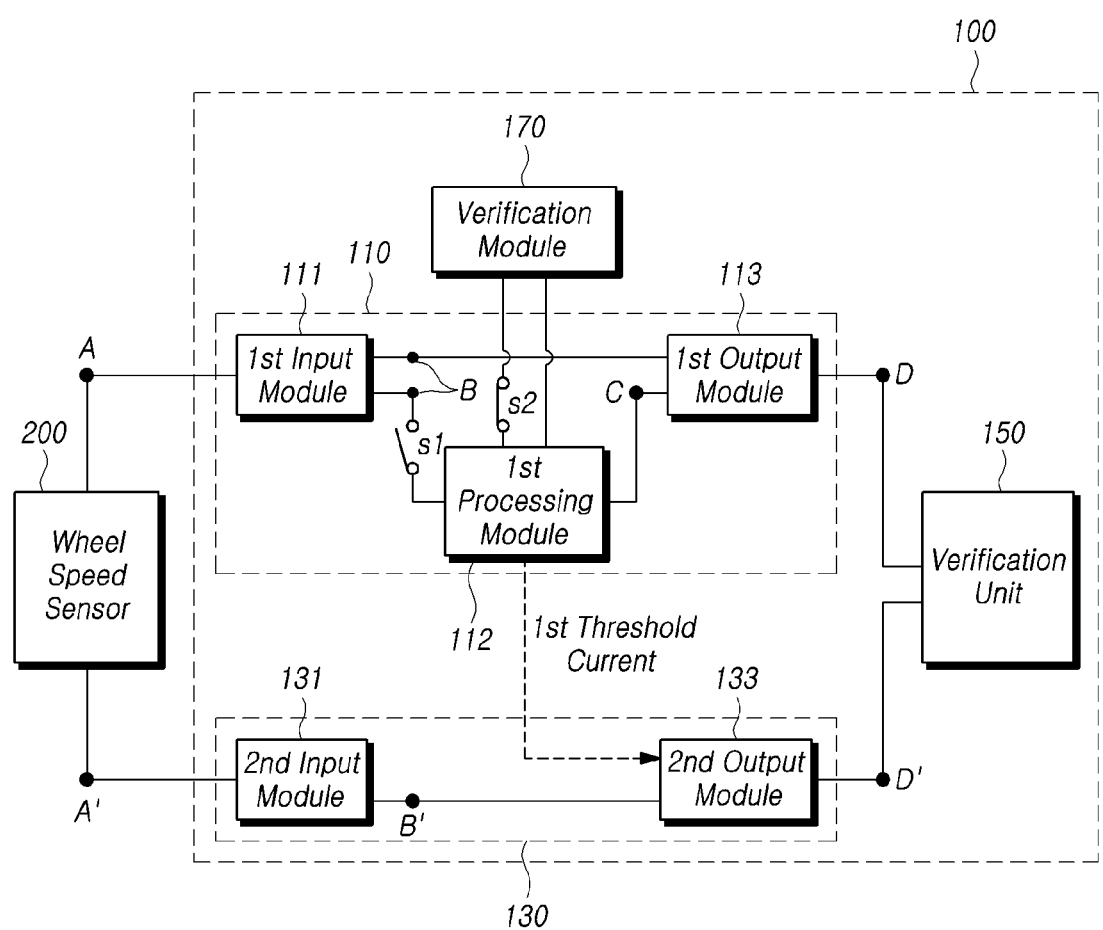
FIGS. 8 to 10 are diagrams for explaining the operation of a wheel speed sensor interface circuit including a verification module for verifying whether a normal operation of a first processing module according to an embodiment of the present disclosure.
Figure 9:
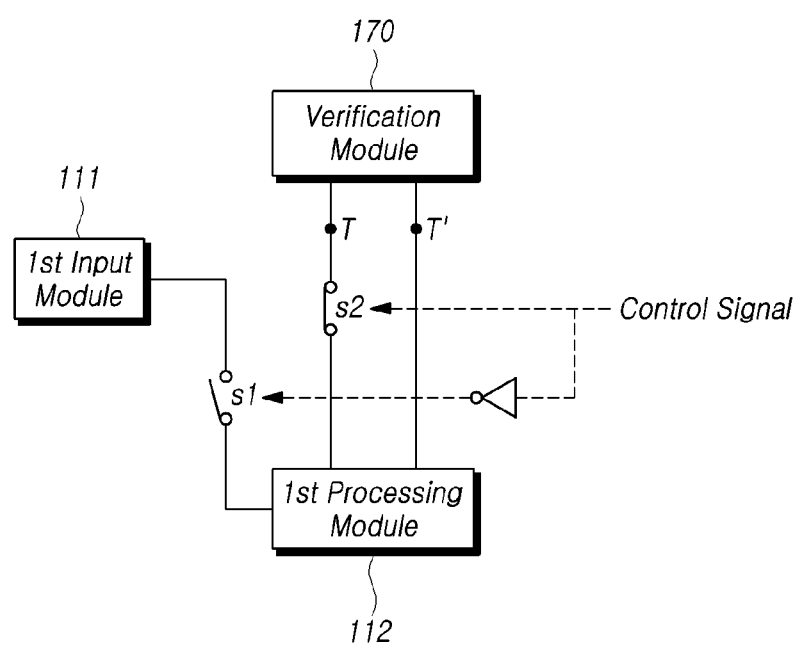

As illustrated in FIG. 8, in the case that the verification module 170 is included, a switch s1 may be provided between the first input module 111 and the first processing module 112. In addition, a switch s2 may be provided between the verification module 170 and the first processing module 112. Referring to FIG. 9, a control signal for controlling on/off may be applied to the switch s1 and s2. The control signal is applied to the switch s1 and the switch s2 so as to have opposite values. Accordingly, a control signal for turning on the switch s1 has a value for turning off the switch s2.

According to an example, control signals for switches may be output from the verification module 170. However, this is an example and is not limited thereto. According to another example, control signals for switches may be output from an ECU or the like that controls the operation of the verification module 170.

That is, in the case that the reference signal is input from the verification module 170 in order to verify whether the normal operation of the first processing module 112, the switch s2 is turned on and the switch s1 is turned off at the same time. Accordingly, the input of the first current signal to the first processing module 112 is cut off, and only the reference signal is input to the first processing module 112. The verification module 170 may compare a reference signal being passed through the first processing module 112 with an expected value to detect whether the normal operation.

Figure 10:
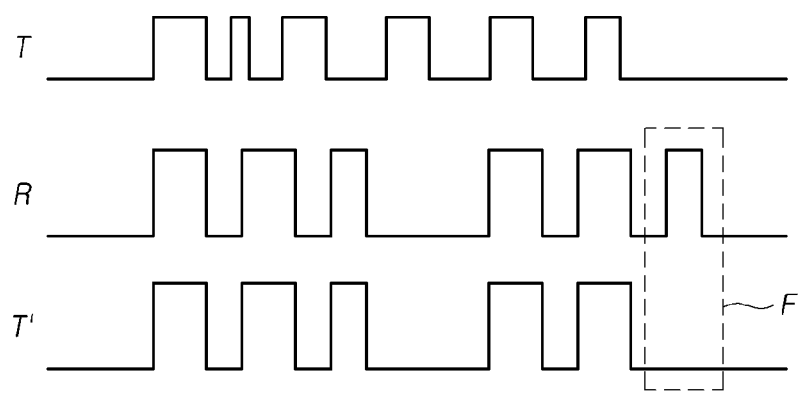

For example, it is assumed that the reference signal applied at T of FIG. 9 has the shape of T illustrated in FIG. 10. R is an expected value of an output that should appear according to an input of a reference signal when the first processing module 112 is normal, and the corresponding information may be stored in advance in the verification module 170. An example of the reference signal input to the verification module 170 at T' of FIG. 9 is illustrated in the form of T' in FIG. 10. In this example, the verification module 170 may compare T' with the R value and determine that the first processing module 112 is in an abnormal state if there are different parts F.

According to an example, the verification module 170 may verify whether the first processing module operates normally only when the vehicle having the wheel speed sensor interface circuit 100 is started. That is, when the vehicle is started, the connection to the wheel speed sensor 200 may be blocked, and an abnormal state of the first processing module 112 may be verified. If it is determined that there is an abnormality, the verification module 170 may transmit a signal notifying the occurrence of the abnormality to the ECU or the like to output the corresponding information to the driver.

According to an example, the verification module 170 may verify whether a normality of an ADC module by detecting a digital information output by inputting a predetermined duplicated current/voltage as a reference signal to the ADC module included in the first processing module 112. In addition, the verification module 170 may verify whether the current following module is normal by inputting a simplified scan pattern to the current following module included in the first processing module 112. However, this is an example, and if it is possible to verify whether the first processing module 112 is normal, it is not limited to a specific method.

In the case that the normal state of the first processing module 112 is verified, the first processing module 112 may transmit the first threshold current adjusted according to the low level current followed by the first processing module 112 to the second output module 133. The second output module 133 may replace the second threshold current used as a reference for generating the second voltage signal with the received first threshold current. Accordingly, even if the second processing module 132 is not provided in the second signal processing unit 130, the second output module 133 may utilize the first threshold current to which the current following algorithm is applied. As described above, the second output module 133 may compare the second current signal with the adjusted first threshold current to generate the second voltage signal and transmit it to the verification unit 150.

The verification unit 150 may verify whether the normality based on a comparison result of the first voltage signal and the second voltage signal. If it is determined as the normal operation, the verification unit 150 may transmit the first voltage signal or the second voltage signal to the micro control unit 300.

Accordingly, by omitting some components of the wheel speed sensor interface circuit connected to the low side of the wheel speed sensor, it is possible to secure the reliability and redundancy for the process of transmitting wheel speed information at a lower cost. In addition, since it is possible to self-verify whether the normality through the verification module, and the first threshold current changed in the first signal processing unit can also be used in the second signal processing unit, it is possible to secure higher stability at a lower cost.

Figure 11:
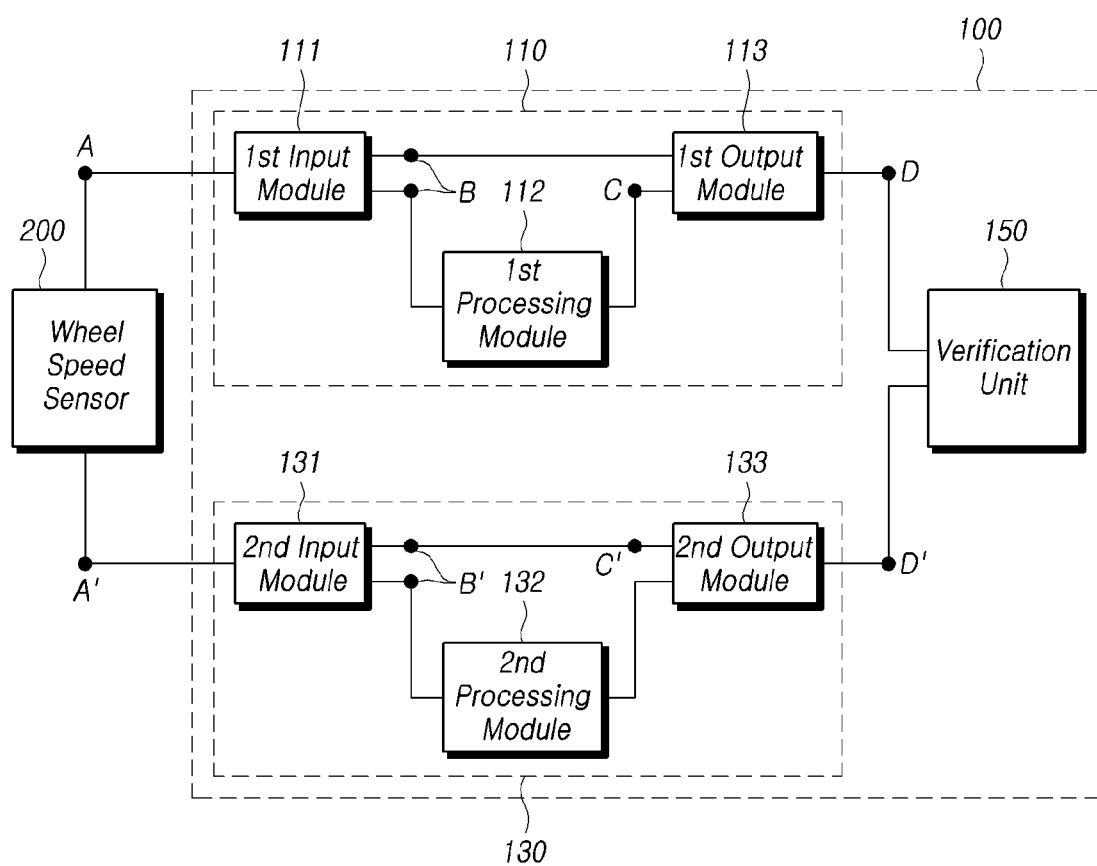
FIG. 11 is a diagram for explaining an operation of a wheel speed sensor interface circuit including a second processing module according to an exemplary embodiment of the present disclosure.

FIG. 11 is a diagram for explaining an operation of a wheel speed sensor interface circuit including a second processing module according to an exemplary embodiment of the present disclosure.

Referring to FIG. 11, the first signal processing unit 110 of a wheel speed sensor interface circuit 100 may include a first input module 111 for mirroring and outputting a first current signal input from a high side of the wheel speed sensor, a first processing module 112 for following a low level current of the first current signal and adjusting a first threshold current according to the followed low level current, and a first output module 113 for outputting the first voltage signal by comparing the first current signal with the first threshold current. This is the same as that of the first signal processing unit 110 described above in FIG. 3, and therefore, a duplicate description will be omitted.

According to an embodiment, the second signal processing unit 130 of the wheel speed sensor interface circuit 100 may include a second input module 131 for mirroring and outputting the second current signal input from the low side of the wheel speed sensor 200, a second processing module 132 for following a low level current of the second current signal and adjusting a second threshold current according to the followed low level current, and a second output module 133 for outputting the second voltage signal by comparing the second current signal with a second threshold current. That is, unlike the embodiment of FIG. 3, the second processing module 132 may be further provided.

Accordingly, the operation of the second signal processing unit 130 may be performed substantially the same as the operation of the first signal processing unit 110. That is, an operation of mirroring and outputting a current signal, adjusting a threshold current based on the current signal, and generating a voltage signal by comparing with the threshold current may be performed substantially the same. However, in this case, since the second processing module 132 also executes the current following algorithm through the current following module, if the verification unit 150 determines that the two voltage signals are the same, the normal state of the processing modules 112 and 132 can be secured, so that it is possible to secure more improved stability and redundancy without the above-described verification module 170.

However, this is an example and is not limited thereto. The above-described verification module 170 may be provided to verify whether at least one of the first processing module 112 and the second processing module 132 is normally operated.

Accordingly, by comparing voltage signals output according to current signals sensed at the high side and low sides of the wheel speed sensor to verify normal operation, it is possible to secure the reliability and redundancy for the process of transferring wheel speed information.

Figure 12:
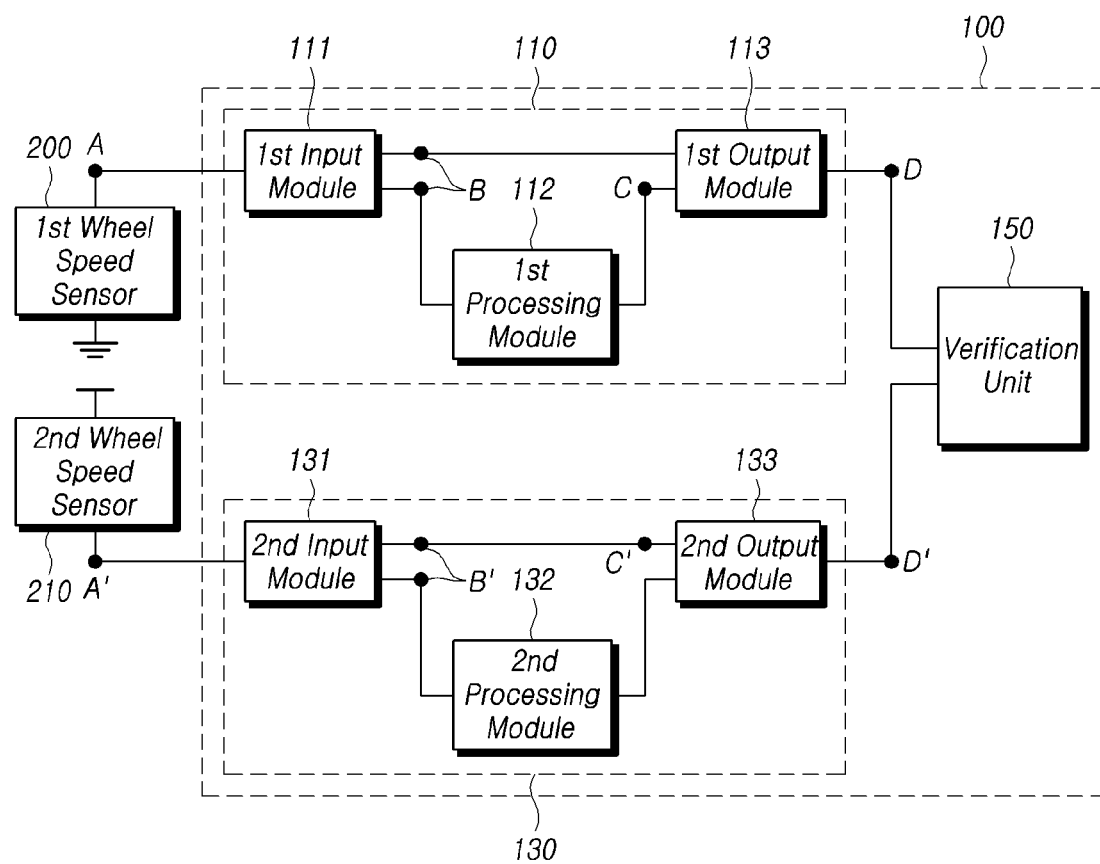
FIG. 12 is a diagram for explaining an operation of a wheel speed sensor interface circuit provided with two wheel speed sensors according to an embodiment of the present disclosure.

FIG. 12 is a diagram for explaining an operation of a wheel speed sensor interface circuit provided with two wheel speed sensors according to an embodiment of the present disclosure.

The wheel speed sensor interface circuit according to an embodiment of the present disclosure may include a first signal processing unit 110 for receiving a first current signal sensed by a high side of a wheel speed sensor and processing the first current signal to output a first voltage signal, a second signal processing unit 130 for receiving a second current signal sensed by a low side of the wheel speed sensor and processing the second current signal to output a second voltage signal, and a verification unit 150 for comparing the first voltage signal and the second voltage signal with each other to verify whether the first voltage signal and the second voltage signal are normal.

Referring to FIG. 12, it is illustrated the case in which two wheel speed sensors 200 and 210 are provided to sense the rotational speed of one wheel. In general, the wheel speed sensor detects the tonnage of a tone wheel and outputs a current signal through a pickup coil disposed in a state spaced apart from the tone wheel that rotates in synchronization with the wheel. According to an embodiment of the present disclosure, pickup coils of two wheel speed sensors may be arranged side by side to detect the tonnage of the tone wheel.

As illustrated in FIG. 12, a first voltage signal may be generated based on the first current signal sensed at the high side of the first wheel speed sensor 200 and may be output to the verification unit 150. In addition, a second voltage signal may be generated based on the second current signal sensed at the low side of the second wheel speed sensor 210 and may be output to the verification unit 150.

In this case, according to an example, unlike FIG. 3, the verification unit 150 may be implemented as a micro control unit for verification rather than a comparator. This is because, unlike the case in which the current signal is respectively sensed at the high side and the low side of the same wheel speed sensor, a current signal is sensed by two wheel speed sensors arranged side by side, and more complex calculations such as synchronization are required.

The verification unit 150 may verify whether the normality normal based on a comparison result of the first voltage signal and the second voltage signal. In the case that it is determined as the normal operation, the verification unit 150 may transmit the first voltage signal or the second voltage signal to the micro control unit 300.

Even in this case, the above-described verification module 170 may be provided to verify whether the normal operation for at least one of the first processing module 112 and the second processing module 132.

Accordingly, by comparing the voltage signals output according to the current signal sensed at the high side of one wheel speed sensor and the current signal sensed at the low side of the other wheel speed sensor to verify normal operation, it is possible to secure the higher stability and redundancy for the process of transmitting wheel speed information.

Figure 13:
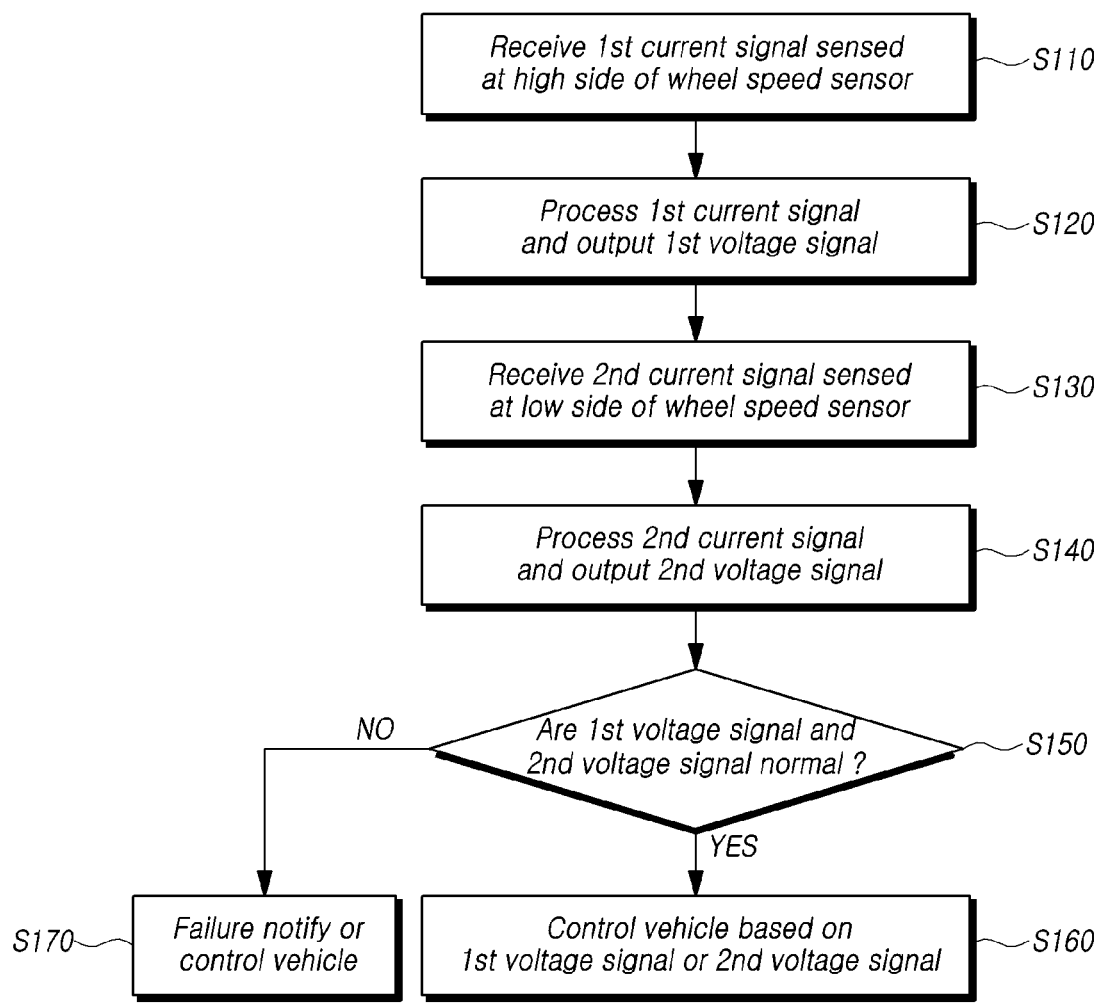
FIG. 13 is a flowchart illustrating an operation method of a wheel speed sensor interface circuit according to an embodiment of the present disclosure.

FIG. 13 is a flowchart illustrating an operation method of a wheel speed sensor interface circuit according to an embodiment of the present disclosure.

The operation method of the wheel speed sensor interface circuit according to the present disclosure may be implemented in the wheel speed sensor interface circuit 100 described with reference to FIGS. 1 and 2. Hereinafter, it will be described an operation method of the wheel speed sensor interface circuit according to the present disclosure and the operations of the wheel speed sensor interface circuit 100 for implementing the same with reference to necessary drawings.

Referring to FIG. 13, a first signal processing unit of the wheel speed sensor interface circuit may receive a first current signal sensed at a high side of a wheel speed sensor [S110], process the first current signal, and output the first voltage signal to the verification unit [S120].

That is, the first processing module of the first signal processing unit may follow the low level current of the first current signal and may change the first threshold current according to the followed low level current.

The first current signal sensed at the high side of the wheel speed sensor may be mirrored in the first input module and transmitted to the first processing module. The first processing module may follow the low level current of the first current signal and may change the first threshold current according to the followed low level current. This is, when an abnormal current generated due to an external environment is instantaneously large or small, to prevent the voltage signal input to the micro control unit from not being normally applied.

The first processing module may detect the low level of the first current signal while following the low level current in the falling edge state among levels of the first current signal. The first processing module may change the first threshold current according to the change of the followed low level current.

The first output module of the first signal processing unit may output a first voltage signal by comparing the first current signal with the first threshold current.

The first output module may compare the first current signal with the first threshold current to create the first voltage signal. In the case that the first current signal is higher than the first threshold current, the first output module may generate the first voltage signal at a high level among the target voltage levels. In the case that the first current signal is lower than the first threshold current, the first output module may generate the first voltage signal at a low level among the target voltage levels. According to an example, the first output module may transmit the generated first voltage signal to the verification unit.

Referring again to FIG. 13, the second signal processing unit of the wheel speed sensor interface circuit may receive a second current signal sensed at the low side of the wheel speed sensor [S130], and processes the second current signal to output the second voltage signal to the verification unit [S140].

That is, the second processing module of the second signal processing unit may follow a low level current of the second current signal and may change the second threshold current according to the followed low level current.

The second current signal sensed at the low side of the wheel speed sensor may be mirrored in the second input module and transmitted to the second processing module. The second processing module may follow the low level current of the second current signal and may change the second threshold current according to the followed low level current.

The second processing module may detect the low level of the second current signal while following the low level current in the falling edge state among levels of the second current signal. The second processing module may change the second threshold current according to the change of the followed low level current.

The second output module of the second signal processing unit may output a second voltage signal by comparing the second current signal with the second threshold current.

The second output module may compare the second current signal with the second threshold current to generate the second voltage signal. In the case that the second current signal is higher than the second threshold current, the second output module may generate the second voltage signal at a high level among the target voltage levels. In the case that the second current signal is lower than the second threshold current, the second output module may generate the second voltage signal at a low level among the target voltage levels.

According to an example, the second output module may transmit the generated second voltage signal to the verification unit.

In FIG. 13, steps S110, S120, S130, and S140 are shown in order, but is not limited thereto. The operations performed in steps S110 and S120 may be performed substantially simultaneously with the operations performed in steps S130 and S140.

Referring again to FIG. 13, the verification unit of the wheel speed sensor interface circuit may compare the first voltage signal and the second voltage signal to verify whether the first voltage signal and the second voltage signal are normal [S150].

The verification unit may compare the first voltage signal and the second voltage signal to verify whether the first voltage signal and the second voltage signal are normal. Since the first current signal and the second current signal are sensed according to the rotational speed of the same wheel of the vehicle, they may be substantially the same within an error range that may occur due to processing in different paths.

Accordingly, if the first voltage signal and the second voltage signal based thereon are substantially the same, the verification unit may determine that each component of the wheel speed sensor and the interface circuit operates normally.

Referring again to FIG. 13, the micro control unit may control the vehicle based on the first voltage signal or the second voltage signal [S160].

In the case that it is determined that each component of the wheel speed sensor and the interface circuit is operating normally, the verification unit may transmit the first voltage signal or the second voltage signal to the micro control unit. The micro control unit may receive a voltage signal sensed by the wheel speed sensor and output through the wheel speed sensor interface circuit. The micro control unit may determine a current state of the vehicle, such as a vehicle speed and a moving direction, based on the voltage signals received from the wheel speed interface circuit. The micro control unit can perform control of ABS, etc. related to the wheels of the vehicle based on the current state of the vehicle.

Referring again to FIG. 13, the micro control unit may notify the failure and control the vehicle [S170].

In the case that the verification unit determines that each component of the wheel speed sensor and the interface circuit is in a failure state, the verification unit may transmit a signal informing this to the micro control unit. The micro control unit may display the failure state on a display in the vehicle. Alternatively, the micro control unit may output a failure state through an acoustic output unit in the vehicle or may output vibration through a steering wheel.

Accordingly, it is possible to secure the redundancy for a process of transmitting wheel speed information by comparing voltage signals output according to current signals sensed at the high and low sides of the wheel speed sensor to verify whether the normal operation.

Figure 14:
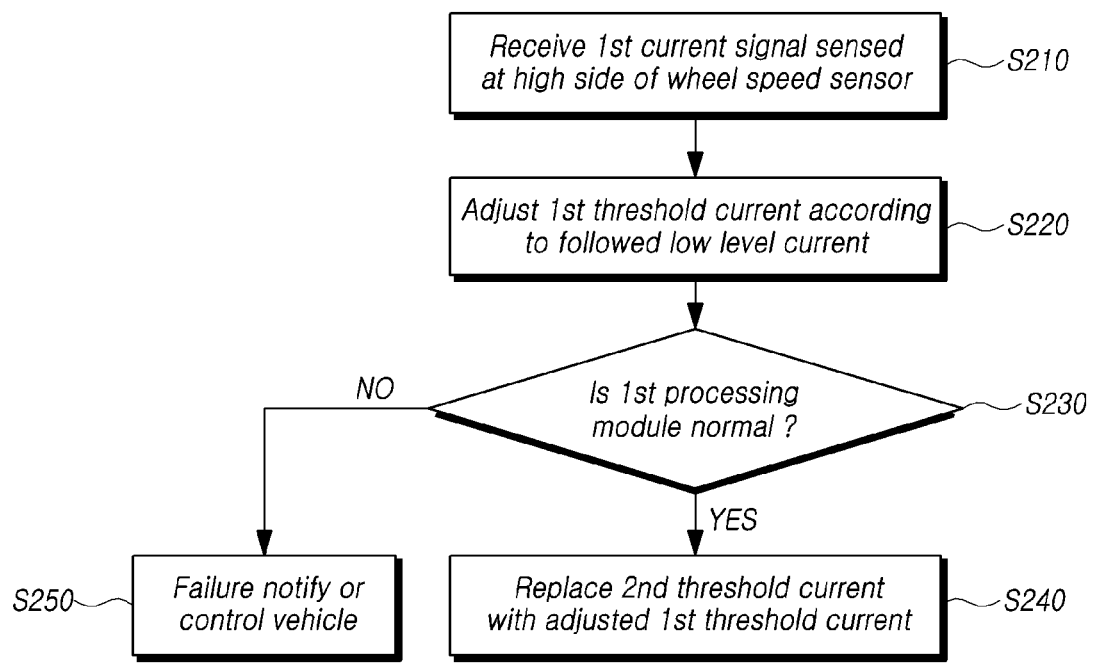
FIG. 14 is a flowchart illustrating an operation method of a wheel speed sensor interface circuit in which a second processing module is omitted according to an embodiment of the present disclosure.

FIG. 14 is a flowchart illustrating an operation method of a wheel speed sensor interface circuit in which a second processing module is omitted according to an embodiment of the present disclosure.

Referring to FIG. 14, the first current signal sensed at the high side of the wheel speed sensor may be input [S210], and the first processing module of the first signal processing unit may follow the low level current of the first current signal, and adjust the threshold current according to the followed low level current [S220].

The first current signal sensed at the high side of the wheel speed sensor may be mirrored in the first input module and transmitted to the first processing module. The first processing module may follow the low level current of the first current signal and may change the first threshold current according to the followed low level current. The first processing module may detect the low level current of the first current signal while following the low level current in the falling edge state among the levels of the first current signal. The first processing module may adjust the first threshold current according to the change of the followed low level current.

Referring again to FIG. 14, the verification module of the first signal processing unit may verify the integrity of the adjustment operation of the first threshold current according to the built-in self-test method [S230].

The verification module may include a built-in self-test module capable of testing the self-operation of the first processing module. According to an example, the verification module may verify the integrity of an ADC module by detecting a digital information output by inputting a predetermined duplicated current/voltage to the ADC module. In addition, the verification module may verify the integrity by inputting a simplified scan pattern to the current following module. However, this is an example, and if it is possible to verify the integrity of the first processing module, it is not limited to a specific method.

Referring again to FIG. 14, in the case that the second output module of the second signal processing unit is verified to be in a normal state, the adjusted first threshold current may be received and the second threshold current may be replaced with the adjusted first threshold current [S240].

In the case that the integrity is verified, the first processing module may transmit the first threshold current adjusted according to the low level current followed by the first processing module to the second output module. According to an example, in the case that the second processing module and the verification module are not provided, the second output module may output a second voltage signal by comparing the second current signal with the second threshold current. If the verification module is provided and the integrity of the first processing module is verified, the second output module may receive the adjusted first threshold current.

The second output module may replace the second threshold current used as a reference for generating the second voltage signal with the received first threshold current. Accordingly, even though the second processing module is omitted from the second signal processing unit, the second output module may utilize the first threshold current to which the current following algorithm is applied.

The second output module may generate a second voltage signal by comparing the second current signal with the received first threshold current. The second output module may generate the second voltage signal at a low level among the target voltage levels in the period when the second current signal is lower than the first threshold current. According to an example, the second output module may transmit the generated second voltage signal to the verification unit.

Thereafter, the verification unit may verify whether the first voltage signal and the second voltage signal are normal based on a comparison result of the first voltage signal and the second voltage signal. In the case that it is determined as the normal operation, the verification unit may transmit the first voltage signal or the second voltage signal to the micro control unit. Referring again to FIG. 14, the micro control unit may notify the failure and control the vehicle [S250]. Since this is substantially the same as step S170 of FIG. 13, detailed descriptions will be omitted.

Figure 15:
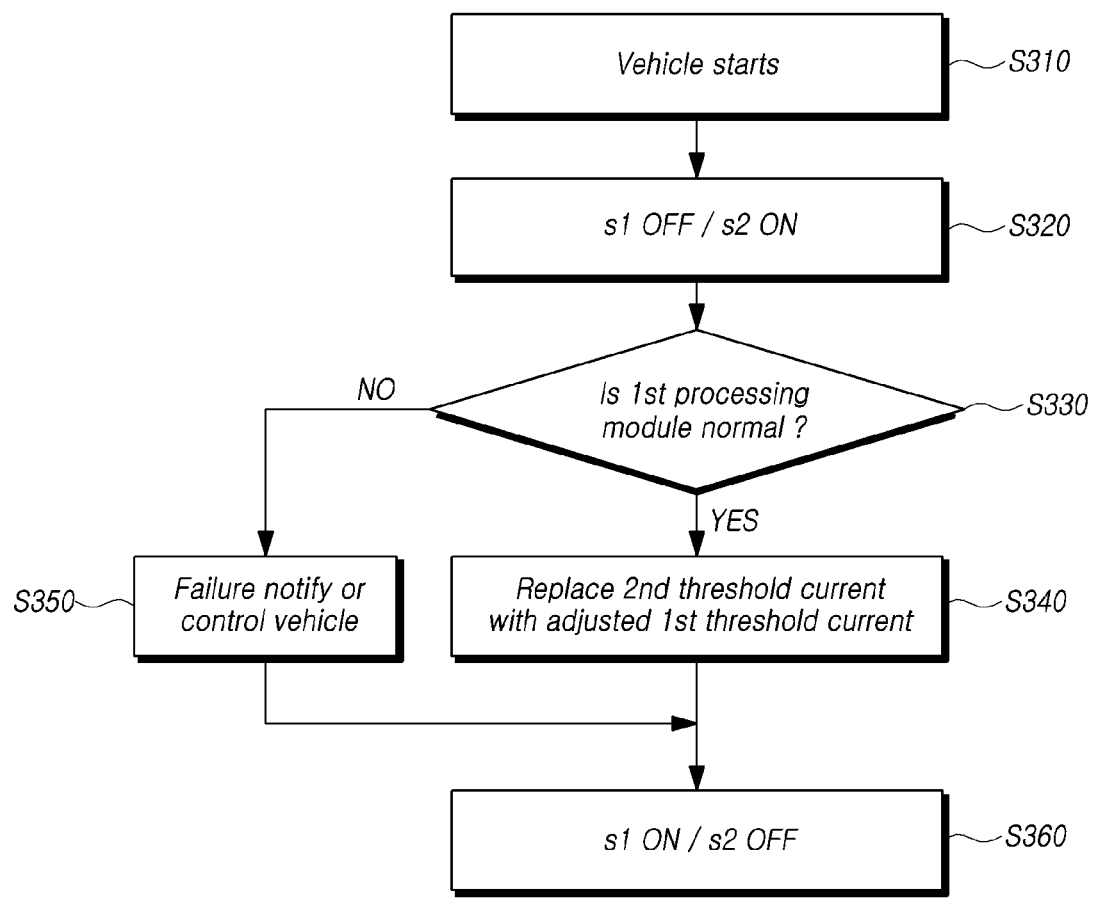
FIG. 15 is a flowchart illustrating control of a switch when verifying whether a normal operation of a first processing module according to an embodiment of the present disclosure.

FIG. 15 is a flowchart illustrating control of a switch when verifying whether a normal operation of a first processing module according to an embodiment of the present disclosure.

According to an example, in the case that the verification module is included in the wheel speed sensor interface circuit, a switch s1 may be provided between the first input module and the first processing module. In addition, a switch s2 may be provided between the verification module and the first processing module. According to an example, a control signal for controlling on/off may be applied to the switch s1 and s2. The control signal is applied to the switch s1 and the switch s2 so as to have opposite values. Accordingly, a control signal that turns on the switch s1 has a value that turns off the switch s2.

According to an example, control signals for switches may be output from the verification module. However, this is an example and is not limited thereto. According to another example, control signals for switches may be output from an ECU or the like that controls the operation of the verification module.

Referring to FIG. 15, according to an example, the vehicle in which the wheel speed sensor interface circuit is installed may be started [S310]. In order to input the reference signal from the verification module, the switch s2 may be turned on and the switch s1 may be turned off at the same time [S320]. Accordingly, the input of the first current signal to the first processing module is cut off, and only the reference signal is input to the first processing module. The verification module may detect whether the normal operation by comparing the reference signal passed through the first processing module with an expected value [S330].

If the reference signal passed through the first processing module is the same as the expected value of the output that should appear according to the input of the reference signal, the first processing module may be determined to be normal. In this case, the second output module may replace the second threshold current used as a reference for generating the second voltage signal with the adjusted first threshold current [S340].

If it is determined that there is an abnormality in the first processing module, the verification module may transmit a signal notifying the occurrence of the abnormality to the ECU, etc., and output the information to the driver or perform vehicle control [S350].

When the verification operation is completed, the switch s2 may be turned off, and the switch s1 may be turned on at the same time [S360]. Accordingly, the first current signal is input to the first processing module, and the reference signal input to the first processing module is blocked.

According to this, by omitting some components of the wheel speed sensor interface circuit connected to the low side of the wheel speed sensor, it is possible to secure the reliability and redundancy for the process of transmitting wheel speed information at a lower cost.

The present disclosure described above may be embodied as computer readable codes on a medium in which a program is recorded. The computer-readable medium includes all types of recording devices in which data readable by a computer system is stored. Examples of computer-readable media include a hard disk drive (HDD), solid state disk (SSD), silicon disk drive (SDD), ROM, RAM, CD-ROM, magnetic tape, floppy disk, and optical data storage device. It also includes those implemented in the form of carrier waves (e.g., transmission over the Internet). In addition, the computer may include the signal processing unit 130 of the present disclosure.

The above description and the accompanying drawings provide an example of the technical idea of the present disclosure for illustrative purposes only, and any person ordinary skilled in the art including the present disclosure will be able to make various modifications and variations such as combination, separation, substitution, and alteration of the component within the scope not departing from the essential characteristics of the present disclosure. Therefore, the embodiments disclosed in the present disclosure are not intended to limit the technical concept of the present disclosure, but to describe, and the scope of the technical idea of the present disclosure is not limited by these embodiments. That is, as long as it is within the scope of the object of the present disclosure, one or more of the components may be selectively combined and operated. The scope of protection of the present disclosure should be construed based on the following claims, and all technical ideas within the scope of equivalents thereof should be construed as being included within the scope of the present disclosure.

What is claimed is:

1. A wheel speed sensor interface circuit comprising:
   a first signal processing unit configured to receive a first current signal sensed by a high side of a wheel speed sensor, processing the first current signal, and outputting a first voltage signal;
   a second signal processing unit configured to receive a second current signal sensed by a low side of the wheel speed sensor, processing the second current signal, and outputting a second voltage signal; and
   a verification unit configured to compare the first voltage signal and the second voltage signal to verify whether the first voltage signal and the second voltage signal are normal if the first voltage signal is substantially the same as the second voltage signal,
   wherein,
   the first signal processing unit comprises:
   a first input module configured to mirror and output the first current signal inputted from the high side of the wheel speed sensor;
   a first processing module configured to follow a low level current of the first current signal and adjust a first threshold current according to the followed low level current; and
   a first output module configured to output the first voltage signal by comparing the first current signal with the first threshold current, and
   the second signal processing unit comprises:
   a second input module configured to mirror and output the second current signal inputted from the low side of the wheel speed sensor; and
   a second output module configured to output the second voltage signal by comparing the second current signal with a second threshold current.

2. The wheel speed sensor interface circuit of claim 1, wherein the first signal processing unit further comprises a verification module for inputting a reference signal to the first processing module and verifying whether a normal operation of the first processing module by comparing an output signal of the first processing module according to the reference signal with a reference output.

3. The wheel speed sensor interface circuit of claim 2, wherein the verification module connects the verification module and the first processing module while blocking the connection between the first input module and the first processing module when inputting the reference signal to the first processing module, and blocks the connection between the verification module and the first processing module while connecting between the first input module and the first processing module when the verification of the normal operation of the first processing module is completed.

4. The wheel speed sensor interface circuit of claim 3, wherein the verification module verifies whether the normal operation of the first processing module only when a start of a vehicle in which the wheel speed sensor interface circuit is installed.

5. The wheel speed sensor interface circuit of claim 2, wherein the first processing module transmits the adjusted first threshold current to the second output module in the case that the normal operation of the first processing module is verified, and the second output module replaces the second threshold current with the adjusted first threshold current.

6. The wheel speed sensor interface circuit of claim 1, wherein the high side of the wheel speed sensor is a terminal of the wheel speed sensor connected to a power supply, and the low side of the wheel speed sensor is a terminal of the wheel speed sensor connected to ground.

7. The wheel speed sensor interface circuit of claim 1, wherein,
the second signal processing unit further includes a second processing module configured to follow a low level current of the second current signal and adjust the second threshold current according to the followed low level current.

8. A wheel speed sensor interface circuit comprising:
a first signal processing unit for receiving a first current signal sensed by a high side of a first wheel speed sensor, processing the first current signal, and outputting a first voltage signal;
a second signal processing unit for receiving a second current signal sensed by a low side of a second wheel speed sensor, processing the second current signal, and outputting a second voltage signal; and
a verification unit for comparing the first voltage signal and the second voltage signal with each other to verify whether the first voltage signal and the second voltage signal are normal if the first voltage signal is substantially the same as the second voltage signal,
wherein,
the first signal processing unit comprises:
a first input module configured to mirror and output the first current signal inputted from the high side of the wheel speed sensor;
a first processing module configured to follow a low level current of the first current signal and adjust a first threshold current according to the followed low level current; and
a first output module configured to output the first voltage signal by comparing the first current signal with the first threshold current, and
the second signal processing unit comprises:
a second input module configured to mirror and output the second current signal inputted from the low side of the wheel speed sensor;
a second processing module configured to follow a low level current of the second current signal and adjust a second threshold current according to the followed low level current; and
a second output module configured to output the second voltage signal by comparing the mirrored second current signal with a second threshold current.

9. An operation method of a wheel speed sensor interface circuit comprising:
receiving a first current signal sensed by a high side of a wheel speed sensor;
processing the first current signal and outputting a first voltage signal;
receiving a second current signal sensed by a low side of the wheel speed sensor;
processing the second current signal and outputting a second voltage signal; and
verifying whether the first voltage signal and the second voltage signal are normal if the first voltage signal is substantially the same as the second voltage signal by comparing the first voltage signal and the second voltage signal,
wherein,
the processing the first current signal and outputting the first voltage signal comprises:
mirroring and outputting, by a first input module, the first current signal inputted from the high side of the wheel speed sensor;
following, by a first processing module, a low level current of the first current signal and adjusting a first threshold current according to the followed low level current; and
outputting, a first output module, the first voltage signal by comparing the first current signal with the first threshold current, and
the processing the second current signal and outputting the second voltage signal comprises:
mirroring and outputting, by the second input module, the second current signal input from the low side of the wheel speed sensor; and
outputting, by the second output module, the second voltage signal by comparing the second current signal with a second threshold current.

* * * * *